United States Patent [19]
Crowley et al.

[11] Patent Number: 5,304,930
[45] Date of Patent: Apr. 19, 1994

[54] REMOTELY POSITIONED MRI SYSTEM

[75] Inventors: Christopher W. Crowley, San Diego; Freeman H. Rose, Del Mar, both of Calif.

[73] Assignee: Panacea Medical Laboratories, Carlsbad, Calif.

[21] Appl. No.: 12,053

[22] Filed: Feb. 1, 1993

[51] Int. Cl.$^5$ .............................................. G01R 33/20
[52] U.S. Cl. ...................................................... 324/309
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,296,378 | 10/1981 | King | 324/313 |
| 4,379,262 | 4/1983 | Young | 324/309 |
| 4,471,306 | 9/1984 | Edelstein | 324/309 |
| 4,521,733 | 6/1985 | Bottomley | 324/309 |
| 4,542,343 | 9/1985 | Brown | 324/307 |
| 4,651,096 | 3/1987 | Buonocore | 324/309 |
| 4,656,425 | 4/1987 | Bendel | 324/309 |
| 4,684,891 | 8/1987 | Feinberg | 324/309 |
| 4,703,270 | 10/1987 | Hall et al. | 324/309 |
| 4,721,914 | 1/1988 | Fukushima | 324/320 |
| 4,868,501 | 9/1989 | Conolly | 324/309 |
| 4,959,612 | 9/1990 | Luyten | 324/311 |
| 4,973,906 | 11/1990 | Bernstein | 324/309 |
| 5,023,554 | 6/1991 | Cho | 324/309 |

OTHER PUBLICATIONS

*Ultra-Fast Imaging*, Mark S. Cohen and Robert M. Weisskoff, Magnetic Resonance Imaging, vol. 9, pp. 1-37, 1991 (no month).

*Nuclear Magnetic Resonance Microscopy with 4-um Resolution: Theoretical Study and Experimental Results*, Z. H. Cho, C. B. Ahn, S. C. Juh, H. K. Lee, R. E. Jacobs, S. Lee, J. H. Yi, J. M. Jo, Medical Physics, vol. 15, No. 6, Nov./Dec. 1988.

*Removal of Static Field Inhomogeneity and Chemical-Shift Effects in NMR Imaging*, J. B. Miller and A. N. Garroway, Journal of Magnetic Resonance 67, 575-579, 1986 (no month).

*Spin-Inversion Imaging: A Technique for NMR Imaging Under Magnetic Fields with High Field Nonuniformities*, Tak Sum Wong and Dov Rosenfeld, IEEE Transactions on Medical Imaging, vol. MI-6, No. 2, Jun. 1987.

*Echo Projection Imaging-A Method to Obtain NMR Images Undistorted by Magnetic Filed Inhomogenieties*, Peter Bendel, IEEE Transactions on Medical Imaging, vol. MI-4, No. 2, Jun. 1985.

*New, Compensated Carr-Purcell Sequences*, Terry Gullion, Journal of Magnetic Resonance 89, 479-484, 1990 (no month).

*Fast-Scan Magnetic Resonance: Principles and Applications*, Felix W. Wehrli, Magnetic Resonance Quarterly, vol. 6, No. 3, pp. 165-236, 1990 (no month).

*Primary Examiner*—Michael J. Tokar
*Attorney, Agent, or Firm*—Nydegger & Associates

[57] ABSTRACT

A remotely positionable device for use in magnetic resonance imaging includes a magnet which is juxtaposable against the object to be imaged without actually surrounding to object. When so positioned, the magnet generates a static nonhomogeneous magnetic field having a determinable measurement surface wherein both the magnitude and the gradient of the field are substantially constant. Additionally, the device includes an RF antenna for periodically pulsing nuclei in the measurement surface with pulses of the Larmor frequency to initially tilt the nuclei and to subsequently refocus the nuclei. The device also includes a pair of gradient coils which generate a gradient fields that are superposed on the static field to encode the nuclei. The RF antenna subsequently receives a plurality of encoded spin echo signals from the refocussed nuclei which are averaged by a computer to create a measured response. Specifically, the nuclei are refocussed and the encoded spin echo signals are received at a rate that is proportional to the gradient of the static flux field. The computer is also used to create an image from a plurality of measured responses taken from differently encoded spin echo signals.

20 Claims, 4 Drawing Sheets

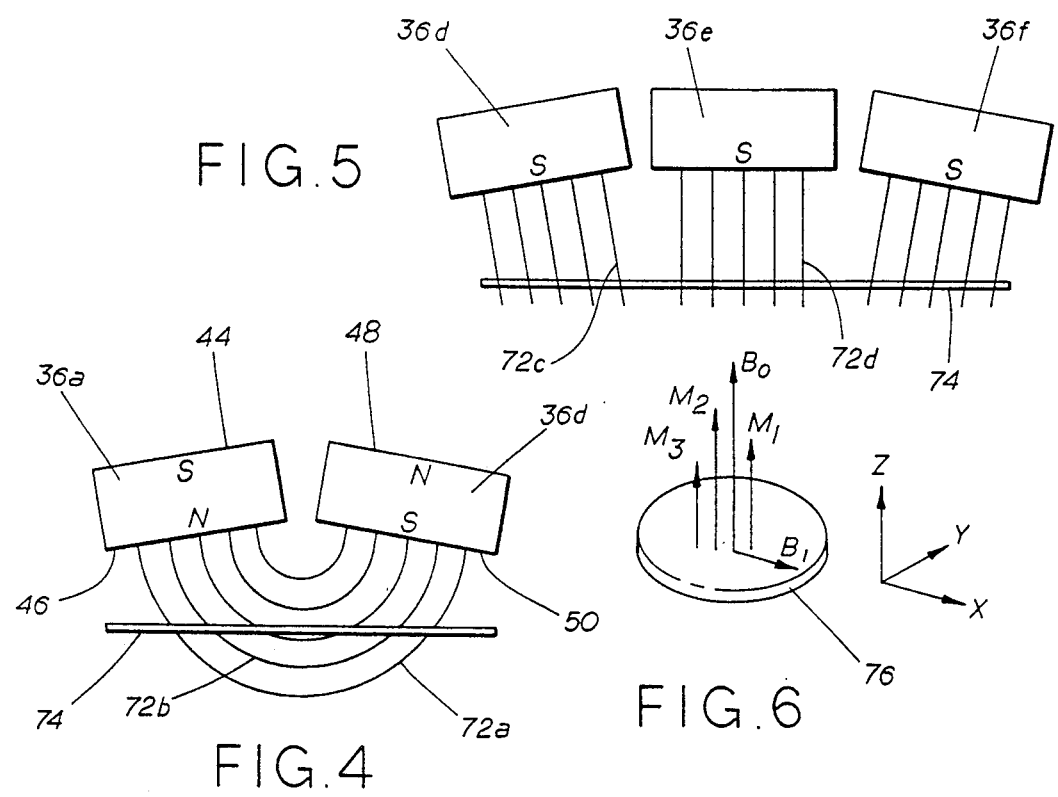
FIG. 5
FIG. 4
FIG. 6
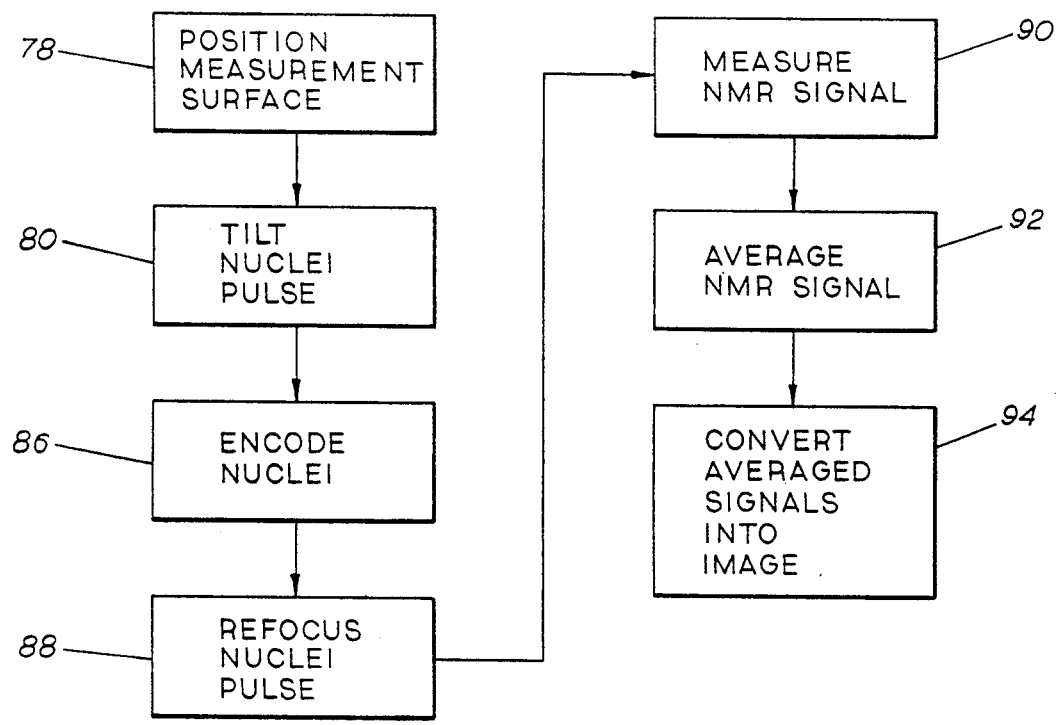
FIG. 7

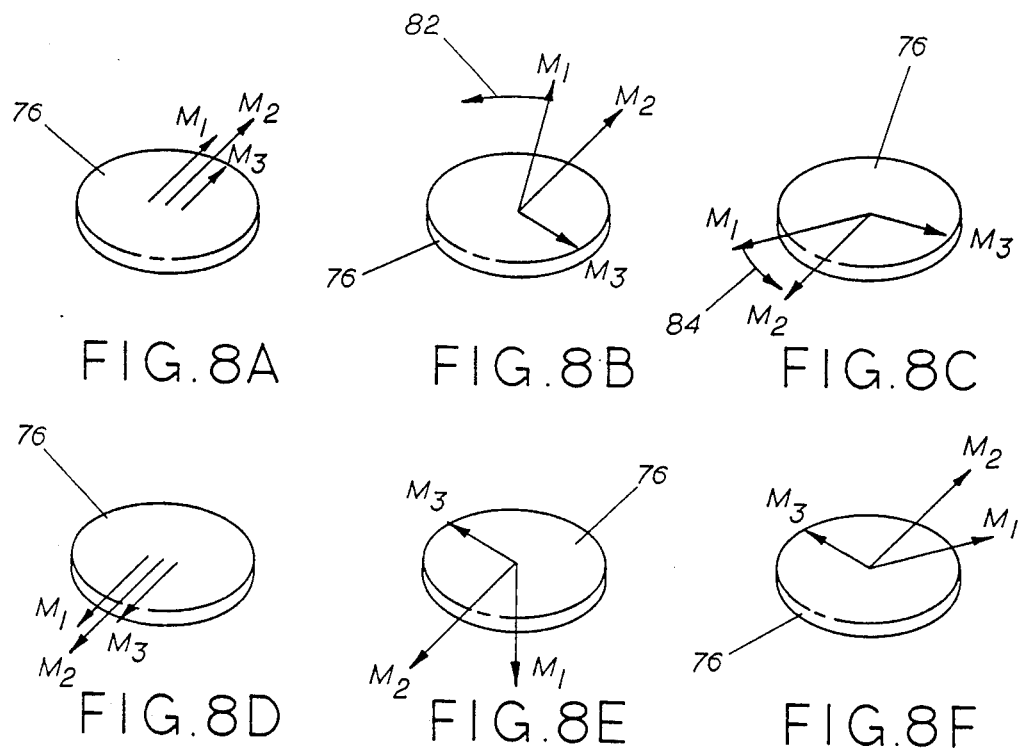
FIG.8A  FIG.8B  FIG.8C
FIG.8D  FIG.8E  FIG.8F
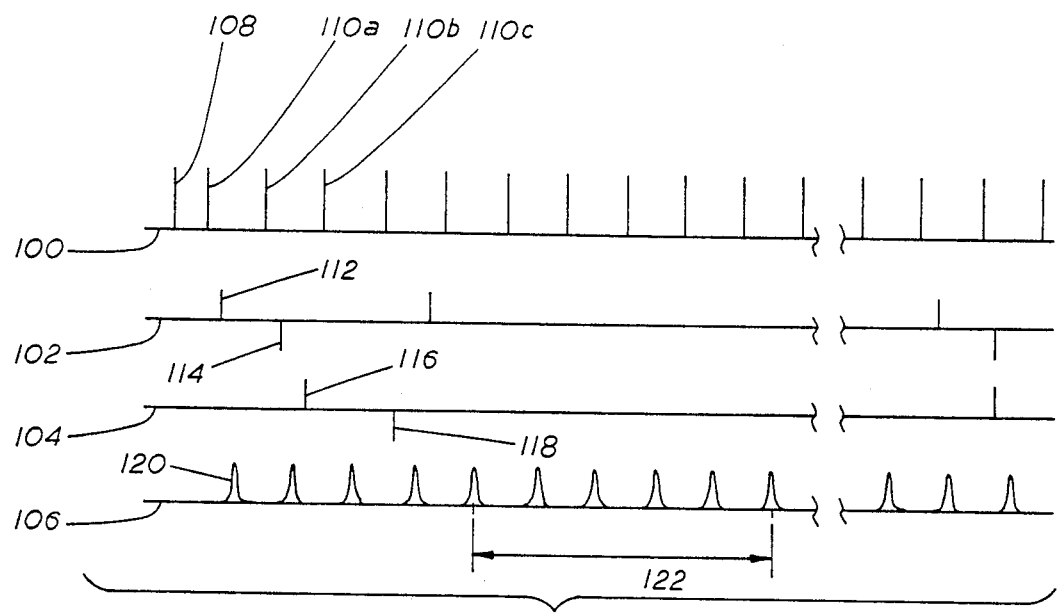
FIG.9

REMOTELY POSITIONED MRI SYSTEM

FIELD OF THE INVENTION

The present invention pertains generally to nuclear magnetic resonance imaging (MRI) systems and their method of use. More particularly, the present invention pertains to remotely positionable MRI systems which employ magnets that do not surround an object. The magnets establish an external magnetic field for noninvasively imaging the nuclei density over a predetermined surface within the object. The present invention is particularly, but not exclusively, useful for creating a nuclear magnetic resonance image of a surface within an object using a nonhomogeneous magnetic field.

BACKGROUND OF THE INVENTION

In the field of nuclear magnet resonance imaging (MRI), it is known that certain atomic nuclei, e.g. $^1H$, $^{19}F$, $^{31}P$, have nuclear magnetic moments which, when placed in a static magnetic field, can only take up certain discrete orientations. Each of these orientations corresponds to a different energy state for the nucleus. Further, it is known that the application of radio frequency (RF) radiation to nuclei in a magnetic field can induce a transition in the energy state of nuclei from one level to another. Such a transition is known as nuclear magnetic resonance (NMR) and it occurs under certain identifiable conditions. Many of these conditions relate to the magnetic fields which are imposed on the nuclei.

A magnetic field is described in terms of flux and lines of flux. From the standpoint of an individual nucleus, there are three essential parameters which are characteristic of the magnetic field at the location of a nucleus. These are: 1) the magnitude of the field, 2) the direction of the field as indicated by the flux line through the nucleus, and 3) the gradient, or rate of change in magnitude, of the field at the location of the nucleus. Each of these parameters has its effect on NMR.

As stated above, nuclei assume certain discrete orientations in a magnetic field which may be subsequently changed by RF radiation. The RF radiation which is most effective for inducing such a change is a particular frequency which depends on the magnitude of the magnetic field at the location of the nucleus. This particular frequency, more familiarly known as the Larmor frequency, is equal to the angular frequency of precession of the nucleus spin vector about the direction of the magnetic field vector. When changes in the orientations of nuclei are induced by radiation applied at the Larmor frequency, the magnetic moments of the nuclei will generate signals which are characteristic of the nuclei. These signals are receivable by an RF antenna. Specifically, for medical applications, it is known that nuclei of various tissues will have different NMR responses. Further, it is known that particular parameters of the NMR response can be weighted using known mathematical techniques to more definitively identify the tissue.

As a practical matter, there are always many nuclei in the object to be imaged by NMR, and each nucleus will generate its own signal. However, as long as the nuclei are spinning in phase with each other, their individual magnetic moments are coherent and create a net moment. Insofar as NMR is concerned, it is known that nuclei, under the influence of a field gradient, will begin to defocus or depolarize after their energy states have been changed. Further, it is known that the rate at which the nuclei defocus is essentially proportional to the dominant field gradient. While it is important to recognize that selectable field gradients can be imposed to encode nuclei, these encoding gradients are controllable and are deliberately imposed for the specific purpose of generating a useable encoded NMR projection which can be received by an RF antenna. This condition, however, is to be distinguished from the condition caused by uncontrollable permanent field gradients which are caused by inhomogeneities in the field. It is these permanent, and basically inherent, field gradients which cause nuclei to spin out of phase with each other, i.e. become defocused. When the nuclei become defocused, a condition is created wherein the NMR signal is not detectable. The object then, is to maintain a focused, in-phase, alignment of the nuclei which will give a net moment signal that can be detected.

A solution to this problem is to create a magnetic field wherein there are no permanent field gradients, or wherein the gradients are so small they will cause negligible defocusing effects on the detectable signal. To this end, numerous inventions have created homogeneous magnetic fields having regions where there are effectively no field gradients. The only field gradients in the homogeneous region will then be those which are intentionally imposed to impart an encoding pattern. This, however, is an idealized homogeneous field system which, in practice, is very difficult to achieve. In some systems a high degree of homogeneity is achievable. The expense, however, is great.

Typically, NMR systems which use homogeneous magnetic fields require exceedingly large high-powered magnets. The systems are extremely bulky and cumbersome and are, therefore, effectively immobile. Further, the region of homogeneity is substantially surrounded by the magnet. Stated differently, the homogeneous field is an internal field. Nevertheless, due to the fact that homogeneous fields are capable of generating high quality images, NMR systems which generate homogeneous fields are widely used.

Because NMR is capable of yielding extremely valuable information on the structure of molecules, one very important application for NMR is in procedures for the noninvasive clinical imaging of the human body. As an example, U.S. Pat. No. 4,498,048 which issued to Lee et al. for an invention entitled "NMR Imaging Apparatus" is typical of a commonly used medical MRI system. In addition to its bulk and immobility, a significant aspect of systems such as the Lee et al. system is that it must substantially surround the object to be imaged. A notable exception in this field, however, is U.S. Pat. No. 5,117,188 which issued to Ohkawa for an invention entitled "Quasi-Open Magnet Configuration for use in Magnetic Resonance Imaging". While systems such as Ohkawa avoid surrounding the imaging region, the generation of an exterior homogeneous field requires the juxtaposition of large and strong opposing sources. Again, as with the other systems which generate homogeneous fields, Ohkawa's system is bulky and effectively immobile.

In light of the above, the present invention has recognized that external nonhomogeneous fields can be generated by relatively small magnet configurations and used to advantage for MRI systems. Such MRI systems must, however, accommodate the characteristics of the external nonhomogeneous field. To do this, there are three particularly important considerations. As more fully discussed below, these are: 1) the rate at which nuclei defocus and can be refocussed, 2) the mechanism of signal to noise ratio (SNR) compensation, and 3) the diffusion of nuclei as they defocus. As further recognized by the present invention, the adverse effects of both the second and third considerations can be overcome by proper use of the first consideration.

An exterior nonhomogeneous flux field has an inherent dominant field gradient, denoted ($G_z$), which acts in a direction, denoted (z), which is substantially perpendicular to surfaces of constant field magnitude, denoted ($B_0$). Such surfaces, in conjunction with selected Larmor frequencies will establish an image plane which is exterior to the static magnet being used to generate the nonhomogeneous field. As alluded to above, it is the dominant and permanent field gradient $G_z$ in a nonhomogeneous field which defocuses the nuclei and causes the NMR signals from the image plane to deteriorate. The dominant gradient may also require wider system bandwidths, thus allowing more noise power to corrupt the NMR signal. Finally the presence of a large $G_z$ cause incoherent dephasing that is irretrievable.

It is known, however, that controllable and selectable flux gradients $G_x$ and $G_y$ (where x and y are perpendicular to z and transverse to the image plane) can be imposed to encode nuclei. In an exterior nonhomogeneous field, however, the gradient $G_z$ dominates the other gradients $G_x$ and $G_y$. This dominance by $G_z$ has its implications. For instance, it is known that once nuclei in the field have been aligned by a pulse of RF radiation into an orientation wherein their net magnetic moment signals are in phase, the nuclei will defocus more quickly from the aligned orientation as $G_z$ is increased. However, as $G_z$ is increased, the nuclei will also refocus at the same faster rate back into the aligned orientation if refocussed by RF radiation. The implication of this, which is recognized by the present invention, is that the increased rate of defocus and refocus can be effectively used to shorten the time interval between nuclei refocussing pulses. From the above, it is to be appreciated that with a very large dominant $G_z$ the time for refocus and defocus is very short. For example, for a $G_z$ equal to 400 Gauss/cm the time for nuclei to refocus and defocus in a one millimeter thick slice is less than 10 microseconds. Realistically, the time interval is so short that it is practical to obtain only one independent measurement of the net magnetic moment in the interval between refocussing pulses.

Restated from above, the fact that nuclei defocus very quickly in an external nonhomogeneous field is offset by the fact that defocused nuclei can be refocussed just as quickly. Therefore, although a useable net magnetic moment is short lived, it can be regained quickly. With this capability, it has been recognized that the effective sampling rate, i.e. the rate at which independent measurements of a net magnetic moment can be made, is on the order of the periodic rate at which nuclei can be refocussed.

The second problem with the dominant gradient $G_z$ in the external nonhomogeneous field is related to the fact that a wider system bandwidth is required to accommodate the wider range of Larmor frequencies. This results in a decreased signal to noise ratio (SNR) due to the extra noise power associated with the wider bandwidth. This decrease in SNR may be offset, however, by the fact that an independent measurement of the net magnetic moment NMR response can be accomplished more quickly in the higher bandwidth cases. Accordingly, with standard signal averaging techniques, an accelerated averaging rate afforded by the high gradient $G_z$, can be used to efficiently compensate for the wider noise bandwidth.

As also indicated above, the third issue of molecular diffusion inherent with nonhomogeneous magnetic fields can be overcome by the rapid refocussing rate which is made possible by a high gradient $G_z$. Simply stated, molecular diffusion is a phenomenon associated With the random motion of defocusing nuclei in a large field gradient $G_z$. Although the random displacement of the diffusing nuclei may be small, the different Larmor frequencies experienced in a large field gradient causes the nuclei to defocus randomly. The real difficulty of molecular diffusion is due to the fact that the nuclei will also refocus randomly. Diffusion related dephasing is, therefore, effectively an irretrievable process. That is, of course, unless the process can somehow be controlled. To this end, the present invention has recognized that the high refocussing repetition rate, afforded by a high field gradient $G_z$, allows nuclei to be refocussed before diffusion proceeds to the point where the previous orientation of nuclei is irretrievable.

Non homogeneous field MRI systems which have heretofore been proposed have neither taught nor suggested ways in which to exploit the unique characteristics of an external nonhomogeneous flux field for the purposes of MRI. For example, both U.S. Pat. No. 5,023,554 which issued to Cho et al. for an invention entitled "Fringe Field MRI", and U.S. Pat. No. 4,379,262 which issued to Young for an invention entitled "Nuclear Magnetic Resonance Systems", disclose the use of a nonhomogeneous magnetic field for MRI and suggest the field may be external to the magnet. In particular, Cho et al. disclose a fringe field having strengths substantially greater than two Tesla. Importantly, neither Cho et al. nor Young, disclose a system or method which uses accelerated refocussing to overcome the above described mechanisms concerning defocusing, the rapid deterioration of SNR or diffusion under the influence of a large dominant gradient $G_z$. Such a system or method is particularly required to compensate for the weaker signals and more dominant gradients present in lower field strength devices (e.g. <2 Tesla).

The refocussing of nuclei necessitated by field inhomogeneities has been considered before. For example, U.S. Pat. No. 4,656,452 which issued to Bendel for an invention entitled "Method to eliminate the Effects of Magnetic Field Inhomogeneities in NMR Imaging and Apparatus therefor" discloses a method whereby nuclei in a magnetic field, which have been pulsed with RF radiation, are repetitively refocussed after they begin to defocus. Bendel, however, does not teach or suggest using such a method with an external magnetic field where $G_z$ dominates the controllable gradients $G_x$ and $G_y$. Therefore, and more specifically, Bendel does not address the problems inherent with establishing and identifying a portion of an external magnetic field where effective MRI can be accomplished using an external nonhomogeneous magnetic field. As another example, U.S. Pat. No. 4,542,343 which issued to Brown for an invention entitled "Computer-Controlled, Portable Pulsed NMR Instrument and Method of Use wherein Depolarization is Ultrashortened using Pseudo Randomly Spaced and Oriented RF Depolarization Pulses" discloses a device and method for using NMR responses to determine the fluid-flow properties of a rock sample. Although Brown discloses use of an external magnetic field, and the use of rapid refocussing techniques to overcome the inadequacies of magnetic field inhomogeneities, Brown is not concerned with imaging. Consequently, Brown neither teaches nor discloses how the components and capabilities of such a system can be used for MRI.

In light of the above it is an object of the present invention to provide a diagnostic MRI device which is compact and remotely positionable relative to the object being imaged. It is another object of the present invention to provide an MRI device which does not confine the measurement surface within the structure of the magnet during an MRI procedure. Another object of the present invention is to provide an MRI device which is configured to establish a substantially flat measurement surface in an external nonhomogeneous magnetic field. Still another object of the present invention is to provide an MRI device which improves the effective SNR in an NMR response by accelerated signal averaging using a sampling rate that is on the order of the periodic rate of refocussing. Yet another object of the present invention is to provide a device which effectively uses an external nonhomogeneous static magnetic flux field for MRI. Another object of the present invention is to provide an MRI device which allows for a trade off between a higher SNR and increased speed in image acquisition. Still another object of the present invention is to provide a method for using an MRI device which accomplishes the objects set forth above. Another object of the present invention is to provide a method for generating images using a plurality of NMR responses which are acquired at a rate that is proportional to the field gradient. An object of the present invention is to provide an MRI device and a method for NMR imaging that is easy to use and comparatively cost effective.

SUMMARY OF THE INVENTION

In accordance with the present invention, a remotely positionable MRI device includes a magnet for generating a static nonhomogeneous magnetic field which is external to the magnet. Importantly, the magnet is configured to establish a region of the field which can be effectively used as a measurement surface. As intended for the MRI device of the present invention, this measurement surface is substantially flat. Further, the measurement surface is characterized by the condition that both the magnitude of the field strength ($B_0$), and the field gradient in the direction normal to the measurement surface ($G_z$) are substantially constant.

An RF antenna is incorporated into the device for several purposes. One purpose of the antenna is to irradiate the nuclei in the measurement surface in the static magnetic field established by the magnet with RF radiation. More specifically, the RF antenna is first used to irradiate nuclei in the measurement surface with a tilting pulse at the appropriate Larmor frequency. This first pulse tilts nuclei out of the spin orientation they had assumed under the influence of $B_0$ in the static magnetic field. Stated differently, the RF antenna initially pulses nuclei in the measurement surface with radiation at the Larmor frequency in order to change their energy levels.

A first gradient coil and a second gradient coil are incorporated into the device and are used for changing magnetic field gradients in the measurement surface in both the x ($G_x$) and y ($G_y$) directions. More specifically, after the nuclei have been initially tilted by the first radiation pulse from the RF antenna, the first and second gradient coils can be selectively activated to orient the spin vectors of individual nuclei in the x-y plane of the measurement surface. This encodes the nuclei with a predetermined transverse phase pattern.

Another function of the RF antenna is to refocus the nuclei after they have been encoded. As indicated above, due to the permanent field gradient in a nonhomogeneous magnetic field, nuclei within the gradient precess at different rates. This results in both coherent defocusing and incoherent diffusion. As also indicated above, this defocusing and diffusion requires that the nuclei be periodically refocussed at an accelerated rate. This refocussing is accomplished by transmitting a refocussing pulse at the appropriate Larmor frequency from the RF antenna. Importantly, accelerated refocussing, when combined with transverse gradient applications, and signal averaging results in the generation of encoded spin echo signals from the nuclei that are useable in image reconstruction.

An additional function of the RF antenna is to receive the spin echo signals which are generated when the nuclei are refocussed. Between refocussing pulses, the RF antenna can be set to receive the encoded spin echo signals that have been generated in the nuclei by the preceding refocussing pulse. Importantly, the rate at which the RF antenna can transmit refocussing pulses and, likewise, the rate at which the RF antenna can receive encoded spin echo signals, is proportional to the field gradient in the static magnetic field. Stated differently, the time interval between refocussing pulses and the time interval between receptions of encoded spin echo signals are both inversely proportional to the field gradient. In accordance with the present invention, one RF antenna can be used to both refocus nuclei and to receive encoded spin echo signals. It is recognized, however, that different RF antennas can be separately used to accomplish these functions.

The MRI device of the present invention also includes electronic means for coordinating the operation of the RF antenna and the encoding gradient coils. Specifically, the transmission of appropriate RF radiation pulses from the antenna, the encoding of the nuclei by the first and second gradient coils, and the reception of encoded spin echo signals from the nuclei must occur in a predetermined and controlled sequence. Additionally, the MRI device includes computer means for controlling the electronic means and for converting a plurality of encoded spin echo signals into an encoded NMR responses. In turn, the computer means converts a plurality of NMR responses into an image. As envisioned by the present invention, this is done by conventional imaging and reconstruction techniques.

It is important to recognize that in accordance with the present invention, the computer means can be programmed to selectively change the magnetic fields generated by the gradient coils which are used to encode the nuclei. Further, the computer means can be selectively programmed to generate as many NMR responses for a particular encoding as are deemed necessary for either the speed of image acquisition or the quality of image desired. Also, the various NMR responses can be weighted as desired to emphasize or highlight the parameters of the nuclei which are of particular interest.

BRIEF DESCRIPTION OF THE DRAWINGS

The novel features of this invention, as well as the invention itself, both as to its structure and its operation will be best understood from the accompanying drawings, taken in conjunction with the accompanying description, in which similar reference characters refer to similar parts, and in which:

FIG. 4 is a cross-sectional view of the static magnets in the integrated surface unit of the present invention, as seen along the line 4—4 in FIG. 1, with representative flux lines in relation to the measurement surface;

FIG. 5 is a cross-sectional view of the static magnets in the integrated surface unit of the present invention, as seen along the line 5—5 in FIG. 1, with representative flux lines in relation to the measurement surface;

FIG. 6 is a perspective view of a portion in the measurement surface of the object being imaged, with representative vectors indicating field gradients and spin moments of individual nuclei;

FIG. 7 is a block diagram of a sequence of steps to be followed during an MRI procedure in accordance with the present invention;

FIGS. 8A-F are sequential representations of the spin moments of representative individual nuclei as they are progressively oriented in the measurement surface during a defocusing and refocussing time interval; and FIG. 9 is a series of graphs showing the time relationship between RF impulses and the resultant NMR signal.

DESCRIPTION OF THE PREFERRED EMBODIMENTS

Figure 1:
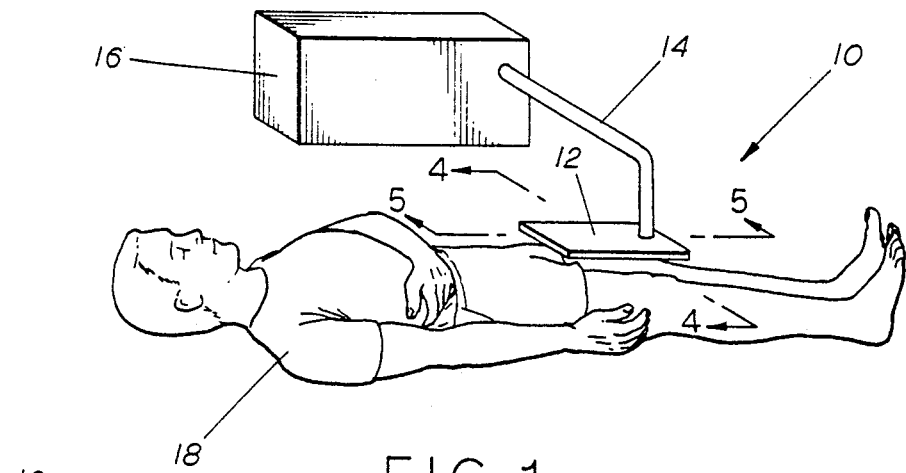
FIG. 1 is a perspective view of the MRI devices of the present invention in use in its intended environment.

Referring initially to FIG. 1, a remotely positionable device for the magnetic resonance imaging of nuclei according to the present invention is shown and generally designated 10. As shown, MRI device 10 generally includes an integrated surface unit 12 which is connected by a moveable gantry 14 to a control console 16. In FIG. 1, the integrated surface unit 12 is shown positioned against the knee of a patient 18. It is to be appreciated that the surface unit 12 can be juxtapositioned next to any portion of the body of patient 18 according to the desires of the operator. Furthermore, it is to be appreciated that a gantry 14 may not be necessary for the support of integrated surface unit 12. If so, the unit 12 may be hand held. This capability for the device 10 is, of course, dependent on the particular field strength and penetration depth which has been engineered for the device 10 and its consequent weight.

Figure 2:
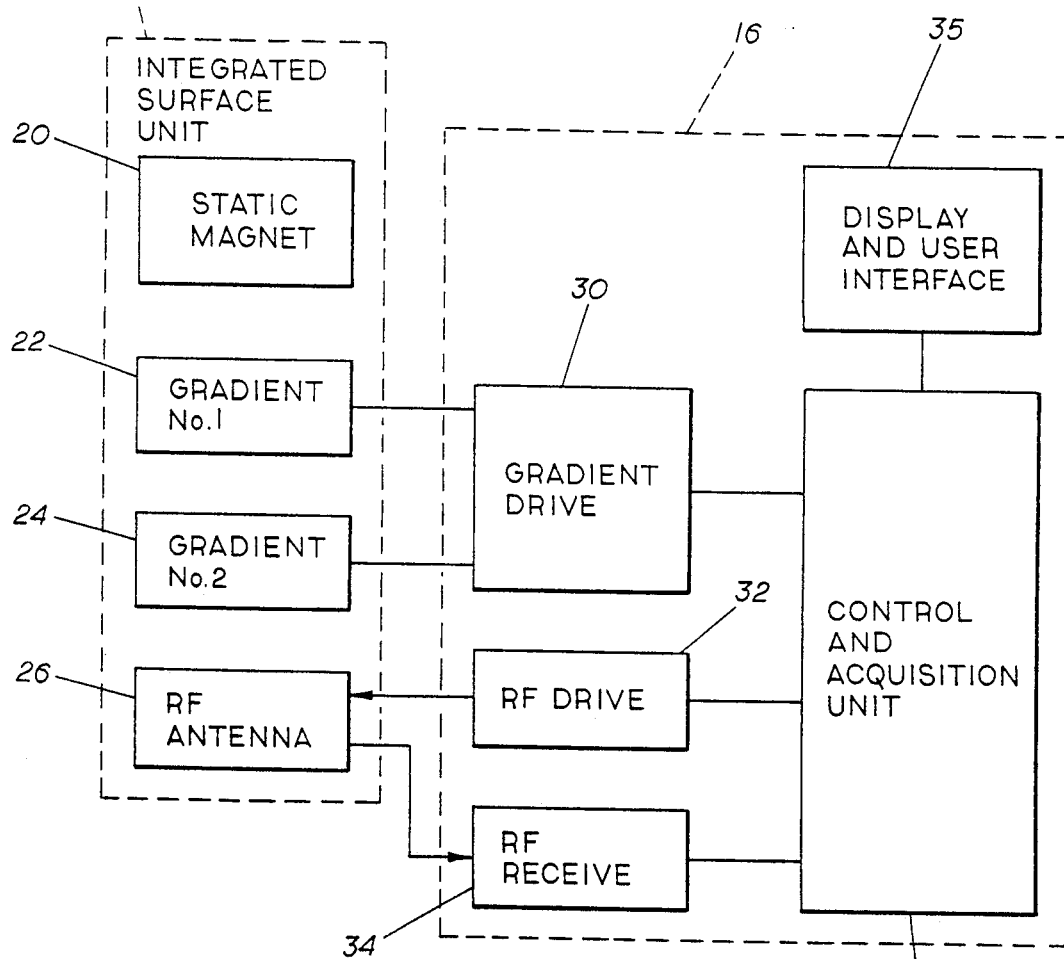
FIG. 2 is a schematic diagram of the control components of the present invention.

The major components of integrated surface unit 12 and control console 16, together with their interactive connections, will be best seen in the schematic block diagram set forth in FIG. 2. There it is seen that the integrated surface unit 12 includes a static magnet 20 which is operatively positioned relative to a first gradient 22, a second gradient 24, and an RF antenna 26. For purposes of the present invention, the static magnet 20 may be of any type well known in the pertinent art, such as a permanent magnet, a superconducting magnet, or a conventional electrical magnet. Further, it is to be appreciated that, though only one RF antenna 26 is shown for the present invention, mutually compatible antennas can be used. Specifically, as mentioned above, one RF antenna can be used to refocus nuclei, and another RF antenna can be used to receive encoded spin echo signals from refocussed nuclei.

FIG. 2 also shows that the control console 16 includes a control and acquisition unit 28 which is directly connected to a gradient drive 30, an RF drive 32 and an RF receive 34. Further, the control and acquisition unit 28 is also directly connected to a display and user interface 35. Further, it is seen that gradient drive 30 of control console 16 is connected directly to both first gradient 22 and second gradient 24 of integrated surface unit 12. The interconnection between integrated surface unit 12 and control console 16 also includes direct connections from RF antenna 26 of unit 12 to both RF drive 32 and RF receive 34 of control console 16. For the purposes of the present invention, the control and acquisition unit 28 of control console 16 may be any computer equipment well known in the pertinent art which is capable of coordinating the activation of first and second gradients 24, 26 with the operation of RF antenna 26.

Figure 3:
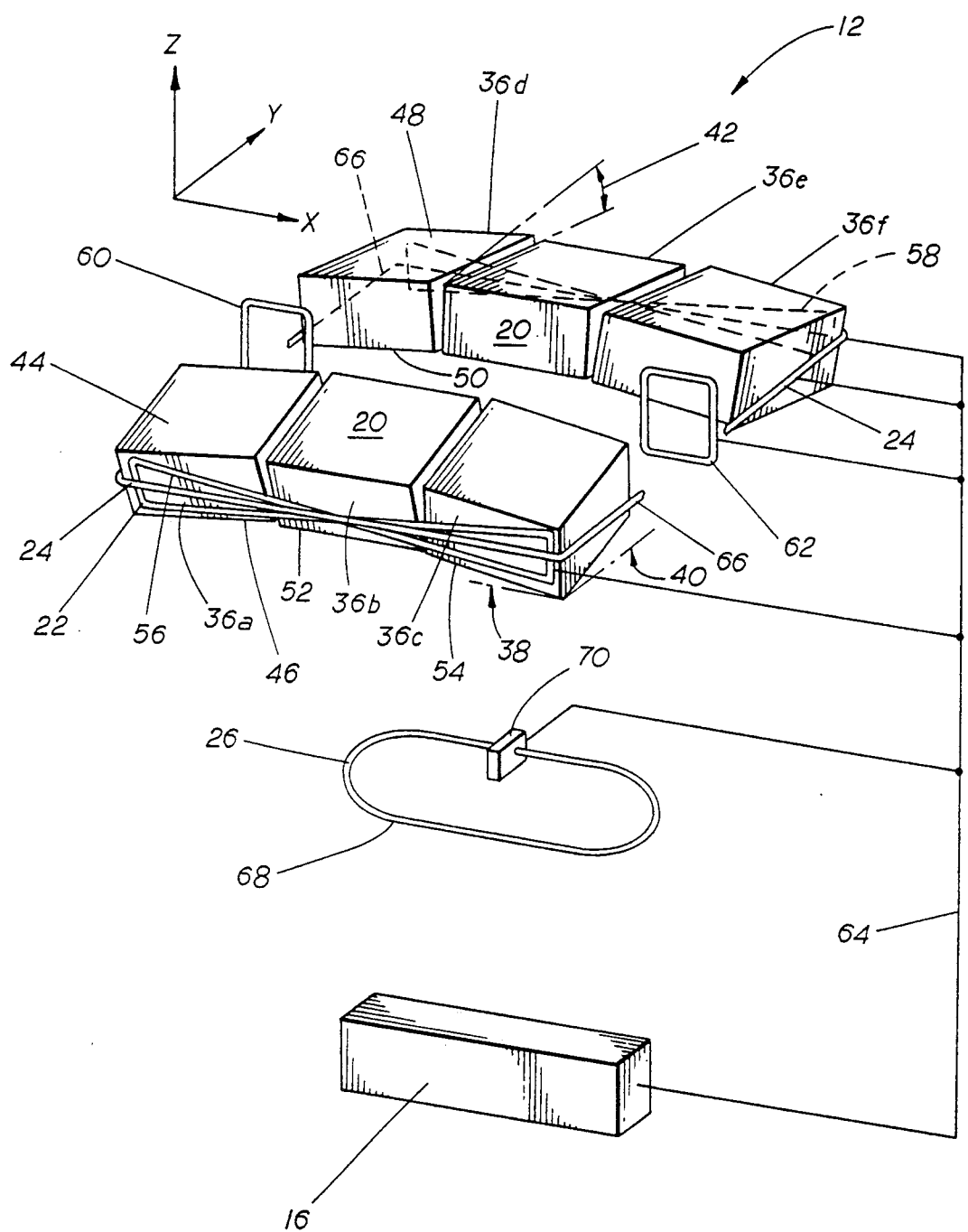
FIG. 3 is an exploded perspective view of the integrated surface unit of the present invention, with portions in phantom, showing the electronic connections between the unit and the controlling electronic components.

FIG. 3 shows an exploded view of the integrated surface unit 12 and the relative positions of the magnet 20, gradient coils 22, 24 and RF antenna 26. More specifically, FIG. 3 shows that for a preferred embodiment of the device 10, the static magnet 20 comprises six individual magnetic blocks 36 a-f. Further, it is seen that the individual magnetic blocks 36 a-f can be selectively tilted, as suggested by the angles 38, 40, and 42, to give magnet 20 a configuration which will generate a flux field having desired design characteristics. In particular, it is desired that magnet 20 generate an external nonhomogeneous flux field which is characterized by a substantially planar measurement surface wherein the magnitude of the field strength ($B_0$), and the field gradient ($G_z$), are substantially constant. Because FIG. 3 is an exploded view, it is to be appreciated that the distance between magnetic block 36a and 36d is relatively much less than as shown. Likewise, the distance between magnetic blocks 36b and 36e, as well as the distance between blocks 36c and 36f, is less.

It is also to be understood that the polarities of the blocks 36a-c are aligned, and that the polarities of the magnetic blocks 36d-f are aligned. In an alternate embodiment, the polarities between 36a and 36d, for example, may be reversed. Consequently, as between magnetic blocks 36a and 36d, if surface 44 of block 36a is South (S), surface 46 of block 36a is North (N), and block 36d will be oriented so that the surfaces 48 and 50 of block 36d will be respectively North (N) and South (S). A cross reference to FIG. 4 further illustrates this configuration. It will be appreciated, however, that either magnetic block 36a or 36d may be inverted. The resultant flux field will be altered, but the purposes of the present invention may still be accomplished using the altered flux field.

As indicated above, the magnetic blocks 36 a-c are aligned with each other, and the magnetic block 36d-f are aligned with each other. Accordingly, by way of example, if surface 46 of magnetic block 36a is North (N), then the surfaces 52 and 54 of blocks 36b and 36c, respectively, will also be North (N). Another cross reference, this time to FIG. 5, may be helpful. When arranged into one of the configuration schemes suggested here, the magnet 20 will generate an external nonhomogeneous flux field which has a dominant flux gradient $G_z$ in the Z direction indicated by the x-y-z cartesian coordinate system shown in FIG. 3.

As intended for the present invention, the magnet 20 must be capable of generating an external nonhomogeneous static magnetic field having, as more fully described below, a substantially flat measurement surface 74. This is so, regardless whether the magnet 20 comprises the magnetic blocks 36a-f as disclosed above or is some other magnet well known in the pertinent art that is capable of generating a static magnetic field.

Integrated surface unit 12 also includes the first gradient coil 22 and the second gradient coil 24. As shown in FIG. 3, first gradient coil 22 effectively comprises a bow tie assembly 56 which is mounted externally to magnet 20 against the blocks 36a-c, and a bow tie assembly 58 which is mounted externally to magnet 20 against the blocks 36d-f. Additionally, first gradient coil 22 includes a loop 60 and a loop 62 which are positioned between the magnetic blocks 36a-c and the magnetic blocks 36d-f, substantially as shown. All components of the first gradient coil 22 are electrically connected to the control console 16 through a general connection 64. When activated by the control and acquisition unit 28 of control console 16, it intended that the first gradient coil 22 impart a flux gradient, $G_x$, onto the flux field generated by magnet 20 which is substantially in the X direction.

The second gradient coil 24 is intended to impart a flux gradient, $G_y$, onto the flux field generated by magnet 20 which is substantially in the Y direction. As shown, the second gradient coil 24 comprises a loop 66 which generally surrounds all of the magnetic blocks 36a-f in magnet 20. Like the first gradient coil 22, second gradient coil 24 is connected to control console 16 via the general connection 64. It is to be appreciated that the gradient coils 22, 24 are only exemplary possibilities and that other means known in the pertinent art can be used to accomplish the same purpose.

Still referring to FIG. 3 it can be seen that the RF antenna 26 comprises an electrically conducting loop 68 and a selectively tunable capacitor bank 70 which is connected in series with the loop 68. As shown the RF antenna 26 is connected to the control console 16 via the general connection 64. For the present invention, it will be understood that general connection 64 is merely illustrative of the electrical connections required to connect the components of integrated surface unit 12 to the control console 16. These individual connections may, of course, be accomplished by any means well known in the art. For example, where the device 10 includes a hand held unit 12, the general connection 64 may be a cable. On the other hand, where a gantry 14 needs to be employed, the general connection 64 may comprise individual wires which are threaded through the gantry 14 between unit 12 and console 16. FIG. 4 and FIG. 5 show internal views of magnetic blocks 36 as they are positioned inside the integrated surface unit 12, together with the flux lines 72 of the external nonhomogeneous magnetic flux field which are generated by the magnet 20. The particular lines 72a-d shown in FIGS. 4 and 5 are only illustrative of one possibility wherein a measurement surface 74 is established. Although both FIGS. 4 and 5 are elevational views, and measurement surface 74 therefore appears as a line, it is to be appreciated that the measurement surface 74 is actually a planar surface. More specifically, it is intended that the measurement surface 74 be substantially flat and be characterized by having a field strength magnitude and a field gradient normal to the measurement surface 74 which are both substantially constant. For example, in one of the preferred embodiments for the present invention, the external nonhomogeneous flux field of the device 10 has a measurement surface 74 wherein the flux magnitude is approximately nine hundred Gauss (900 Gauss) and the flux gradient is approximately four hundred Gauss per centimeter (400 Gauss/cm).

At this point it is important to recognize that magnet 20 must be shaped and configured to create a substantially flat measurement surface 74 in an external nonhomogeneous field which can be selectively encoded by appropriately shaped gradient coils 22,24. Further, the RF antenna 26 must be specifically shaped and configured to irradiate the measurement field 74 with RF pulses which tilt or refocus nuclei in the measurement field 74 in a direction which is substantially perpendicular to the field strength $B_0$ of the magnet 20.

FIG. 6 shows a tissue element 76 from patient 18 which is located in the measurement surface 74. As shown, the tissue element 76 is subjected to the nonhomogeneous flux field and, more specifically, the magnitude of the field at the element 76 is $B_0$. Also shown in FIG. 6 are vectors $M_1$, $M_2$, and $M_3$ which respectively represent the spin vectors of individual nuclei in the tissue element 76. Actually, there are n nuclei in the element 76 and, accordingly, there will be $M_1 \ldots M_n$ spin moment vectors in the element 76 which different sizes and which may be oriented in many different directions. $M_1$, $M_2$, and $M_3$ are only representative of these moment vectors. Under the influence of $B_0$, the vectors $M_1$, $M_2$, and $M_3$ are all aligned substantially as shown and, as indicated above, the range of Larmor frequencies for the nuclei is proportional to the range of values for $B_0$. For purposes of discussion, consider that the spin vectors $M_1$, $M_2$, and $M_3$ will each precess at different rates in the presence of the earlier described permanent flux gradient, and that the nucleus with spin vector $M_1$ will precess faster than spin vector $M_2$, which in turn will precess faster than spin vector $M_3$. A discussion of the operation of the device 10 is best appreciated with these characteristics in mind.

OPERATION

For a discussion of the operation of device 10 FIGS. 7, 8 and 9 are best considered together. In overview, FIG. 7 sets forth the steps to be followed during the operation of the device 10, while FIGS. 8A-F show alignments of the spin moment vectors $M_1$, $M_2$, and $M_3$ in tissue element 76 at different times during an MRI procedure. FIG. 9 then shows a time sequence for the RF pulses and the flux gradient controls which drive, encode and measure the NMR signals generated by the spin moment vectors $M_n$ during and NMR procedure using the device 10.

FIG. 7 indicates at block 78 that the first step in the MRI procedure is to juxtapose the integrated surface unit 12 next to the area of patent 18 to be imaged. As implied above, the nonhomogeneous field generated by magnet 20 is external to the surface unit 12. As intended for the preferred embodiment of the present invention, the measurement surface 74 is also external to the surface unit 12 and is a range of approximately three to six centimeters (3-6 cm) distant therefrom. In any event, the surface unit 12 is to juxtaposed against patient 18 so that measurement surface 74 is located internally in patient 18.

With the measurement surface 74 located as desired, RF antenna is activated to pulse the measurement surface 74 with a tilting pulse at the larmor frequency having a magnitude of $B_1$ (Note: this tilting pulse may, but need not be, what is commonly known as a ninety degree pulse). This step is indicated by block 80 in FIG. 7 and results in a tilting of the nuclei that is represented by the change in the orientation of spin moment vectors $M_n$ when FIG. 6 is compared With FIG. 8A. The RF signal in FIG. 9 shows that the tilting pulse initiates the procedure. As stated above, this tilting pulse changes the energy level of the nuclei.

Before considering subsequent steps in the procedure, as set forth in FIG. 7, consider the precession sequences of the nuclei shown in FIGS. 8A-F in conjunction with the tilting and refocussing RF pulses shown in FIG. 9 (Also note: the refocussing pulse may, but need not be, what is commonly known as a one hundred and eighty degree pulse). As stated above, the initial tilting RF pulse from antenna 26 at the Larmor frequency tilts the nuclei (see FIG. 8A). Immediately thereafter, the nuclei begin to precess and defocus or dephase out of their initial alignment. Recall, that $M_1$ precesses faster than $M_2$ and that $M_2$ precesses faster than $M_3$. These differences result in a representative defocused arrangement as shown in FIG. 8B. In actuality this defocusing continues. The $M_n$ then become completely incoherent and there is no useable net spin moment signal which can be used to characterize the nuclei. To overcome this, the nuclei are periodically refocussed using a refocussing RF pulse at the Larmor frequency. In effect this flips the $M_n$ from the arrangement shown in FIG. 8B into the arrangement shown in FIG. 8C. Effectively, the faster $M_1$ which was ahead of $M_2$ before being refocussed, is now behind $M_2$ after being refocussed. The same is true for $M_2$ relative to $M_3$. The result is that, each time after being refocussed, the $M_n$ refocus or realign themselves. This is shown by considering FIGS. 8B-D in sequence. Specifically consider $M_1$. In FIG. 8A, $M_1$ is shown precessing in the direction of arrow 82. After being refocussed it will precess in the direction of arrow 84. Each time, however, the nuclei immediately begin to defocus after having been refocussed, and they must again be refocussed. This refocussing returns the nuclei to the focussed alignment shown in FIG. 8A. The sequence is then repeated.

The present invention recognizes that the rate at which the nuclei defocus, and the rate at which they are capable of being refocussed, are the same and are dependent on the field gradient $G_z$ which is normal to the measurement surface 74. As stated above, in an external nonhomogeneous flux field, $G_z$ is dominant. For a flux field having a $G_z$ gradient of approximately four hundred Gauss per centimeter (400 Gauss/cm) the time for the Mn of the nuclei to defocus and refocus is less than ten microseconds (10 msec) in a one millimeter (1 mm) slice. However, if the refocussing of nuclei using refocussing RF pulses is accomplished at a rate which minimizes the time during which the nuclei are defocused, there is very little time in which to measure the NMR signal of the net spin moment for $M_n$. In practice, it may not be practical to obtain more than a single measurement of the net magnetic moment during each cycle. Thus, the sampling rate will be on the order of the periodic rate of refocus.

In order to properly group the NMR spin echo signals which are generated during an MRI procedure, it is desirable to encode the nuclei so they can be effectively identified. This is done by imparting a predetermined transverse phase pattern onto the nuclei with the gradient coils 22,24. Specifically, after the nuclei have been tilted into the measurement surface 74 by an initial tilting RF pulse from antenna 26, or after subsequent refocussing of the nuclei by a refocussing RF pulse, the nuclei can be encoded. To do this, any appropriate combination of x and y gradients may be imposed onto the nuclei by selected application of current to either the gradient coil 22 or the gradient coil 24. FIG. 9 shows that pulses from the gradient coils 22 and 24 can be selectively applied with either positive of negative changes to encode the nuclei. It happens that once a gradient pulse is applied, the same transverse phase pattern for an encoding will persist until there is a subsequent pulse. This phenomenon allows the operator to encode as desired and maintain a particular encoding pattern for as long as desired. This particular step in the operation of device 10 is shown as block 86 in FIG. 7.

Block 88 in FIG. 7 indicates that refocussing is accomplished after the encoding step. It happens, however, as indicated by the RF pulses shown in FIG. 9 that encoding can be accomplished any time after the initial tilting RF pulse has been applied. Most commonly, though not necessarily, encoding occurs between refocussing pulses. To accommodate encoding between the refocussing pulses, the refocussing pulses must be capable of refocussing encoded nuclei with either x or y orientations. It is recognized that multiple repetitions of duplicate refocussing pulses is not appropriate for this task due to the cumulative effects of errors over the large number of refocussing pulses implied by the accelerated refocussing rate. In an article written by Guillion et al. entitled "New, Compensated Carr-Purcell Sequences" which appear in Journal Of Magnetic Resonance 89,479-484 (1990), the cumulative error problem is addressed and several examples are given of patterns of one hundred and eighty degree refocussing pulses that are stable for either x or y orientations over several hundred repetitions.

It is also recognized by the present invention that encoding introduces arbitrary orientations in the x-y plane that require stabilized refocussing. Accordingly, although spin echo signals can be averaged immediately after an encoding gradient has been applied, it is preferable if there is a stabilized pattern of refocussing pulses after each encoding, before another transverse encoding pattern is established.

By cross referencing FIG. 7 and FIGS. 8A and 8D with FIG. 9, it will be appreciated that the step of measuring NMR signals is best accomplished at times when the nuclei are refocussed (see FIGS. 8A and 8D). This occurs at a time, after a one hundred and eighty degree pulse has been applied, which is dependent on the magnitude of the flux gradient $G_z$. Block 90 in FIG. 7 indicates this possibility.

Block 92 in FIG. 7 indicates that after an encoded spin echo signal from the nuclei is measured, the signal may be averaged with other NMR signals. This is often necessary because the dominant field gradient $G_z$, in addition to causing rapid defocusing of the nuclei, also may introduce an increased noise bandwidth. However, the accelerated averaging rate which is afforded by $G_z$ allows for a compensated SNR. Stated differently, although the NMR signal may have a poorer SNR due to the dominant $G_z$, the dominant $G_z$ allows for a higher rate of refocussing. Thus, more NMR signals are available within a given time interval for averaging.

The sequencing of pulses and reception of NMR signals in accordance with the present invention will be best understood by referencing FIG. 9. FIG. 9 shows the relationship of a time line 100 for RF pulses from antenna 26 to a time line 102 for x gradient encoding pulses, a time line 104 for y gradient encoding pulses, and a time line 106 for the resultant NMR signals. More specifically, time line 100 shows an initial tilting pulse 108 which, as implied above, is preferably, but not necessarily, a ninety degree pulse. The tilting pulse 108 is then followed by a series of refocussing pulses 110 which are generated at the accelerated refocussing rate discussed above.

As indicated on time lines 102 and 104, the device of the present invention can encode nuclei with both positive and negative pulses. Specifically, time line 102 show a positive x gradient 112 and a negative x gradient 114. Also, time line 104 show a positive y gradient 116 and a negative y gradient 118. Importantly, once a transverse pattern is established by the application of x and y gradients, the pattern will persist. By way of example, the NMR signal 120 is encoded with only the positive x gradient 112 and subsequent pulses are shown to be encoded with different gradients. As indicated above, this encoding allows NMR signals to be properly grouped for averaging. Further, as indicated above, it is preferable to wait for stabilization of the pattern of refocussing pulses before the encoding transverse pattern is changed.

The averaging of NMR signals is important for the resolution and refinement of the NMR response. As indicated in FIG. 9, several NMR pulses can be averaged over a time interval 122. The actual number of NMR pulses which are averaged is discretionary and depends on the particular desires and needs of the operator. Although averaging can be accomplished during the time encoding instabilities are dissipating, it is important that the encoded transverse pattern not be changed during the averaging.

FIG. 7 also shows that a final step in the MRI procedure involves conversion of the NMR signals into a useable image. This is done in the control and acquisition unit 28 of control console 16 for subsequent read out at the display and user interface 35. The actual electronic techniques for converting the NMR signals into an image are well known in the pertinent art and can be employed according to the desires of the operator. Further, it is to be appreciated that the control and acquisition unit 28 can be preprogrammed to coordinate the generation of RF pulses from RF antenna 26 with the reception of NMR signals by the RF antenna. Additionally, the operation of RF antenna 26 must be coordinated with the imposition of encoding gradients. All of the programmed instructions necessary for the coordination of these concerted activities can be accomplished at control and acquisition unit 28 using well known procedures and techniques. An important aspect of the present invention for device 10 is that the sampling of NMR signals is to be accomplished at a rate that is on the order of the periodic rate for refocussing the nuclei. Furthermore, the ability of the device 10 to refocus may be used with an accelerated averaging rate to compensate for the adverse effect of increased noise levels in the NMR signals. The number of averages per encoded pattern may be adjusted to selectively trade off imaging speed for SNR compensation.

While the particular remotely positionable device for the magnetic resonance imaging of nuclei using an external magnetic field as herein shown and disclosed in detail is fully capable of obtaining the objects and providing the advantages herein before stated, it is to be understood that it is merely illustrative of the presently preferred embodiments of the invention and that no limitations are intended to the details of the construction or design herein shown other than as defined in the appended claims.

We claim:

1. A remotely positionable device for the magnetic resonance imaging of nuclei using an external magnetic field which comprises:

means for creating a measurement surface within a nonhomogeneous magnetic field, said measurement surface being characterized by a static magnetic field having a substantially constant magnitude and a substantially constant field gradient in a direction normal to said measurement surface;

means for initially tilting said nuclei in said measurement surface;

encoding means for imparting a predetermined transverse phase pattern on said tilted nuclei to encode said nuclei;

means for refocussing said tilted nuclei at a rate proportional to said field gradient, while maintaining said predetermined transverse phase pattern, to generate encoded spin echo signals;

means for receiving said encoded spin echo signals; and means for converting said encoded spin echo signals into an image of effective nuclei density in said measurement surface.

2. A device as recited in claim 1 wherein said means for creating a measurement surface is a magnet, and said magnet comprises a plurality of magnetic blocks, each said magnetic block being individually positionable relative to other said magnetic blocks to form said measurement surface into a substantially planar configuration.

3. A device as recited in claim wherein said converting means distinguishes weighted parameters of said encoded spin echo signals to ascertain characteristics of said nuclei.

4. A device as recited in claim 1 wherein said means for tilting said nuclei, said means for refocussing said nuclei and said means for receiving said spin echo signals is an RF antenna comprising an electrically conducting loop, and a selectively tunable capacitor bank connected in series with said loop to form a resonant circuit for pulsing said nuclei in said measurement surface and receiving spin echo signals from said nuclei at a preselected frequency.

5. A device as recited in claim 4 wherein said RF antenna uses a tilting pulse to initially tilt said nuclei in said measurement surface and uses a refocussing pulse to subsequently refocus said nuclei in said measurement surface.

6. A device as recited in claim 4 further comprising a computer means electronically connected to said RF antenna and to said encoding means for coordinating activation of said RF antenna with said encoding means to receive selectively encoded spin echo signals.

7. A device as recited in claim wherein said encoding means comprises:

a first gradient coil;

a second gradient coil; and means for selectively energizing said first gradient coil and said second gradient coil to respectively create a first encoding magnetic field and a second encoding magnetic field in said measurement surface to impart said predetermined transverse phase pattern on said encoded nuclei.

8. A device as recited in claim 1 wherein said substantially constant magnitude for said nonhomogeneous flux field is approximately nine hundred Gauss (900 Gauss) and said substantially constant flux gradient for said nonhomogeneous flux field is approximately four hundred Gauss per centimeter (400 Gauss/cm).

9. A device as recited in claim 2 further comprising a moveable gantry for holding and positioning said magnet.

10. A device as recited in claim 1 wherein said means for creating a measurement surface is remotely positionable for juxtaposition relative to said nuclei to be imaged.

11. A system for the magnetic resonance imaging of nuclei which comprises in combination:

a remotely positionable magnet for juxtaposition relative to said nuclei to be imaged, said magnet creating a measurement surface within a nonhomogeneous field, said measurement surface characterized by a static magnetic field having a substantially constant magnitude and a substantially constant field gradient in a direction normal to said measurement surface;

a gradient coil for generating an encoding magnetic field to impart a predetermined transverse phase pattern on said nuclei to encode said nuclei; and an RF antenna coil for transmitting pulses to said nuclei in said measurement surface to initially tilt said nuclei and to subsequently refocus said nuclei to generate encoded spin echo signals, said refocussing being accomplished at a rate proportional to said field gradient and said antenna coil being activated to receive said encoded spin echo signals.

12. A system as recited in claim further comprising means for converting said encoded spin echo signals into an image of effective nuclei density having distinguishable parameters.

13. A system as recited in claim 11 wherein said magnet comprises a plurality of magnetic blocks, each said magnetic block being individually positionable relative to other said magnetic blocks to form said measurement surface into a substantially planar configuration and wherein said substantially constant magnitude for said nonhomogeneous field is approximately nine hundred Gauss (900 Gauss) and said substantially constant field gradient for said nonhomogeneous field is approximately four hundred Gauss per centimeter (400 Gauss/cm).

14. A system as recited in claim 11 wherein said RF antenna comprises an electrically conducting loop, and a selectively tunable capacitor bank connected in series with said loop to form a resonant circuit for pulsing said nuclei in said measurement surface and receiving spin echo signals from said nuclei at a preselected frequency and wherein said RF antenna uses a tilting pulse to initially tilt said nuclei in said measurement surface and uses a pattern of refocussing pulses to subsequently refocus said nuclei in said measurement surface.

15. A system as recited in claim 11 further comprising a second gradient coil and means for selectively energizing said gradient coil and said second gradient coil to respectively create a first encoding magnetic field and a second encoding magnetic field in said measurement surface to impart said predetermined transverse phase pattern on said encoded nuclei.

16. A method for imaging nuclei density in a measurement surface which comprises the steps of:

creating a nonhomogeneous static magnetic field having a substantially constant field magnitude and a substantially constant field gradient in a direction normal to said measurement surface;

pulsing said nuclei in said measurement surface to initially tilt said nuclei;

selectively encoding said nuclei by imparting a predetermined transverse phase pattern on said nuclei;

refocussing said nuclei at a rate proportional to said field gradient, while maintaining said predetermined transverse phase pattern, to generate encoded spin echo signals;

measuring said encoded spin echo signals to generate an encoded response;

averaging a plurality of similarly encoded said encoded responses to refine said response; and converting said refined responses from a plurality of different predetermined phase patterns to create an image of effective nuclei density in said measurement surface.

17. A method as recited in claim 16 wherein said substantially constant magnitude for said nonhomogeneous field is approximately nine hundred Gauss (900 Gauss) and said substantially constant field gradient for said nonhomogeneous field is approximately four hundred Gauss per centimeter (400 Gauss/cm).

18. A method as recited in claim 16 further comprising the step of selecting a predetermined plurality of responses for said averaging step according to a desired refinement for said response.

19. A method as recited in claim 16 wherein said field gradient is approximately four hundred Gauss per centimeter (400 Gauss/cm) and said rate for refocussing said nuclei is approximately once per twenty microseconds (1/20 usecs).

20. A method for imaging nuclei density in a measurement surface which comprises the steps of:

juxtaposing a device in proximity to an object to be imaged, said device comprising a magnet remotely positionable relative to said nuclei to be imaged, said magnet creating a measurement surface within a nonhomogeneous magnetic field, said measurement surface characterized by a static magnetic field having a substantially constant magnitude and a substantially constant field gradient in a direction normal to said measurement surface; a gradient coil for generating an encoding magnetic field to impart a predetermined transverse phase pattern on said nuclei to encode said nuclei; and an RF antenna coil for transmitting pulses to said nuclei in said measurement surface to initially tilt said nuclei and to subsequently refocus said nuclei to generate encoded spin echo signals, said refocussing being accomplished at a rate proportional to said field gradient and said antenna coil being activated to receive said encoded spin echo signals;

selectively varying said phase pattern to establish different encoded phase patterns for said nuclei;

averaging a plurality of said encoded spin echo signals for each said predetermined encoded phase pattern to generate a refined response; and converting said refined responses from a plurality of different predetermined phase patterns to create an image of nuclei density in the measurement surface.

* * * * *